(12) United States Patent
Kamoshida et al.

(10) Patent No.: US 7,193,260 B2
(45) Date of Patent: Mar. 20, 2007

(54) FERROELECTRIC MEMORY DEVICE

(75) Inventors: Masahiro Kamoshida, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 20 days.

(21) Appl. No.: 10/883,736

(22) Filed: Jul. 6, 2004

(65) Prior Publication Data

US 2005/0212019 A1    Sep. 29, 2005

(30) Foreign Application Priority Data

Mar. 25, 2004  (JP)  .............................. 2004-089474

(51) Int. Cl.
*H01L 27/108* (2006.01)

(52) U.S. Cl. ...................... 257/296; 257/295; 257/307; 257/E27.104

(58) Field of Classification Search .................. 257/296
See application file for complete search history.

(56) References Cited

U.S. PATENT DOCUMENTS 5,466,629 A * 11/1995 Mihara et al. .................. 438/3
6,097,051 A * 8/2000 Torii et al. .................. 257/306
2002/0031885 A1* 3/2002 Takashima .................. 438/240

FOREIGN PATENT DOCUMENTS

JP          10-255483          9/1998

* cited by examiner

*Primary Examiner*—Tu-Tu Ho
(74) *Attorney, Agent, or Firm*—Oblon, Spivak, McClelland, Maier & Neustadt, P.C.

(57) ABSTRACT

A ferroelectric memory device includes a first bit line, a second bit line provided adjacent to the first bit line, a first memory cell block including a first terminal, a second terminal, and a plurality of memory cells connected in series between the first and second terminals and arranged in a first direction along the first bit line connected to the first terminal by a first block select transistor, a second memory cell block including a plurality of memory cells, and a plurality of first contacts arranged between the first and second memory cell blocks, each first contact connecting the upper electrode and drain or source electrode of one memory cell.

19 Claims, 6 Drawing Sheets

FERROELECTRIC MEMORY DEVICE

CROSS-REFERENCE TO RELATED APPLICATIONS

This application is based upon and claims the benefit of priority from prior Japanese Patent Application No. 2004-089474, filed Mar. 25, 2004, the entire contents of which are incorporated herein by reference.

BACKGROUND OF THE INVENTION

1. Field of the Invention

The present invention relates to a ferroelectric memory device that stores data in a nonvolatile manner using a ferroelectric capacitor.

2. Description of the Related Art

Recently, a great deal of attention has been paid to a ferroelectric memory (FeRAM: Ferroelectric Random Access Memory), as one type of the semiconductor memories, which is a nonvolatile memory that uses a ferroelectric capacitor. The FeRAM, which is nonvolatile, can be rewritten an order of $10^{12}$ times, and the reading or writing time is about the same as that of the DRAM. Further, the FeRAM can be operated at a low voltage of 2.5 to 5V. Due to these remarkable advantages, it is expected that the FeRAM replaces the entire memory market in near future.

An example of the FeRAM is disclosed in Jpn. Pat. Appln. KOKAI Publication No. 10-255483 filed by the inventor of the present invention. This FeRAM has such a structure in which both terminals of the ferro-electric capacitor are connected to the source and drain of the cell transistor to form a memory cell MC, and a plurality of such memory cells MC are connected in series to form a memory cell block. (This FeRAM will be called "a series connected TC unit type ferro-electric RAM" hereinafter.)

FIG. 7 is a diagram illustrating the layout of an example of the structure of the series connected TC unit type ferroelectric RAM. FIG. 8 is a diagram showing a cross section of the structure shown in FIG. 7 taken along the line VIII—VIII.

A gate electrode 32 is formed via a gate oxide 42 on a semiconductor substrate 30. The gate electrode 32 serves as a word line WL. A diffusion layer (AA: Active Area) 31 is provided on both sides of the gate electrode 32 in the semiconductor substrate 30, and the diffusion layer serves as source and drain electrodes of the cell transistor on both sides, respectively.

A ferroelectric capacitor is provided above the cell transistor, and the ferroelectric capacitor includes a lower electrode 33, a ferroelectric film 34 and an upper electrode 35. The lower electrode 33, ferroelectric film 34 and upper electrode 35 are laminated one on another in this order to form the ferroelectric capacitor. The lower electrode 33 and the diffusion layer 31 are connected to each other via an AA-LE contact 36.

The upper electrodes 35 of two ferromagnetic capacitors formed adjacent to each other in one direction are connected together by a metal 38. The metal 38 and the diffusion layer 31 are connected to each other via an AA-M contact 39. A bit line 40 is provided above the memory cell MC. An insulating oxide layer 41 is formed on the semiconductor substrate 30.

In the ferroelectric memory, which has the above-described structure, the AA-M contact 39 is formed between the upper electrodes 35 within the same memory cell block. Due to the AA-M contact 39 formed there, the extending directional area of the bit line 40 of the ferroelectric memory is increased.

Due to the above-described structure, the bit line 40 is extended and therefore the parasitic capacity of the bit line is increased. As the result of increasing the parasitic capacity of the bit line, the read signal amount of the bit line is decreased.

BRIEF SUMMARY OF THE INVENTION

According to an aspect of the present invention, there is provided a ferroelectric memory device comprising: a first bit line; a second bit line provided adjacent to the first bit line; a first memory cell block including a first terminal, a second terminal, and a plurality of memory cells connected in series between the first and second terminals and arranged in a first direction along the first bit line connected to the first terminal by a first block select transistor, the memory cells each including a cell transistor having a gate, a source and a drain electrode, and a ferroelectric capacitor having a lower electrode connected to the source or drain electrode, a ferroelectric film provided on the lower electrode and an upper electrode provided on the ferroelectric film; a second memory cell block including a third terminal, a fourth terminal, and a plurality of memory cells connected in series between the third and fourth terminals and arranged in the first direction, the third terminal connected to the second bit line by a second block select transistor, the memory cells each including a cell transistor having a gate, a source and a drain electrode, and a ferroelectric capacitor having a lower electrode connected to the source or drain electrode, a ferroelectric film provided on the lower electrode and an upper electrode provided on the ferroelectric film; and a plurality of first contacts arranged between the first and second memory cell blocks, each first contact connecting the upper electrode and drain or source electrode of one memory cell.

DETAILED DESCRIPTION OF THE INVENTION

Figure 1:
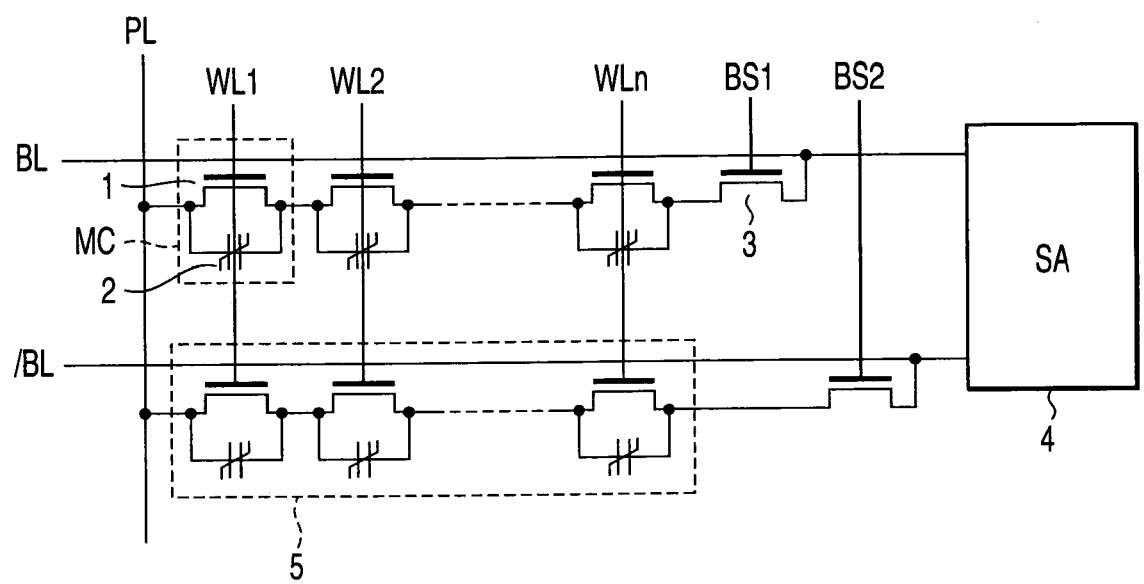
FIG. 1 is a circuit diagram of an FeRAM according to an embodiment of the present invention.

An embodiment of the present invention, which has been proposed as a solution to the drawback of the prior art technique described above, will now be described with reference to accompanying drawings. In the following descriptions, structural elements having the same function and structure as those mentioned above will be designated by the same reference numerals, and the explanations therefore will not be repeated unless they are necessary.

FIG. 1 is a circuit diagram of FeRAM according to the embodiment of the present invention. The FeRAM is a series connected TC unit type ferroelectric RAM.

In this figure, both terminals of a ferroelectric capacitor 2 are connected to source and drain electrodes of a cell transistor 1, respectively, and thus one memory cell MC is formed. A plurality of such memory cells MC are connected in series to form a memory cell block 5. One of terminals of each memory cell block is connected to a bit line BL or /BL via a block selection transistor 3. The other terminal of each memory cell block is connected to a plate line PL.

A gate electrode of the block selection transistor 3 is connected to a block selection line BS. Thus, a block selection signal is supplied to the gate electrode of the block selection transistor 3. A gate electrode of the cell transistor 1 is connected to a word line WLn. A bit line pair made of bit lines BL and /BL are connected to a sense amplifier circuit (SA) 4.

Figure 2:
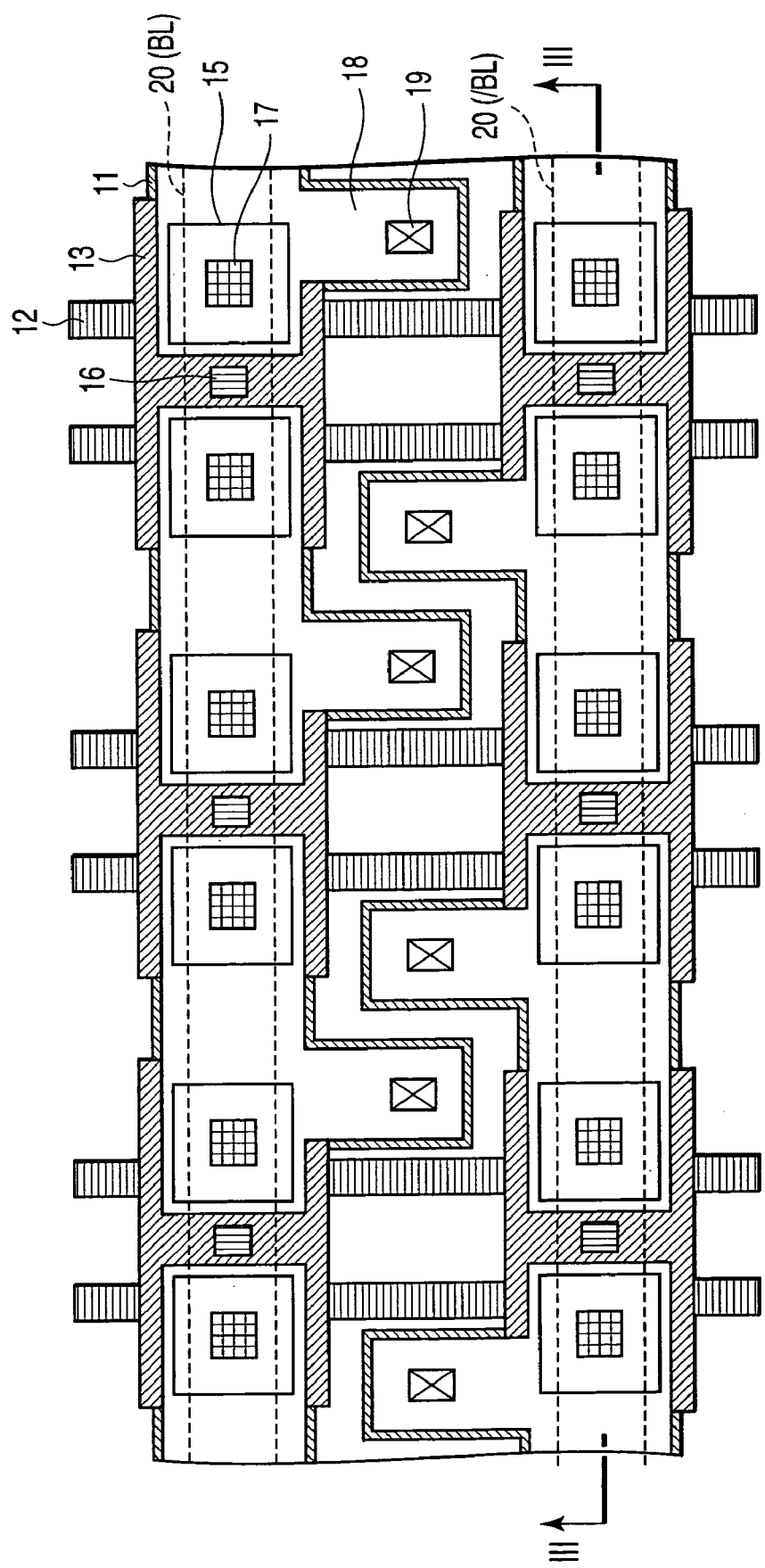
FIG. 2 is a diagram showing the layout of the structure of the FeRAM shown in FIG. 1.
Figure 3:
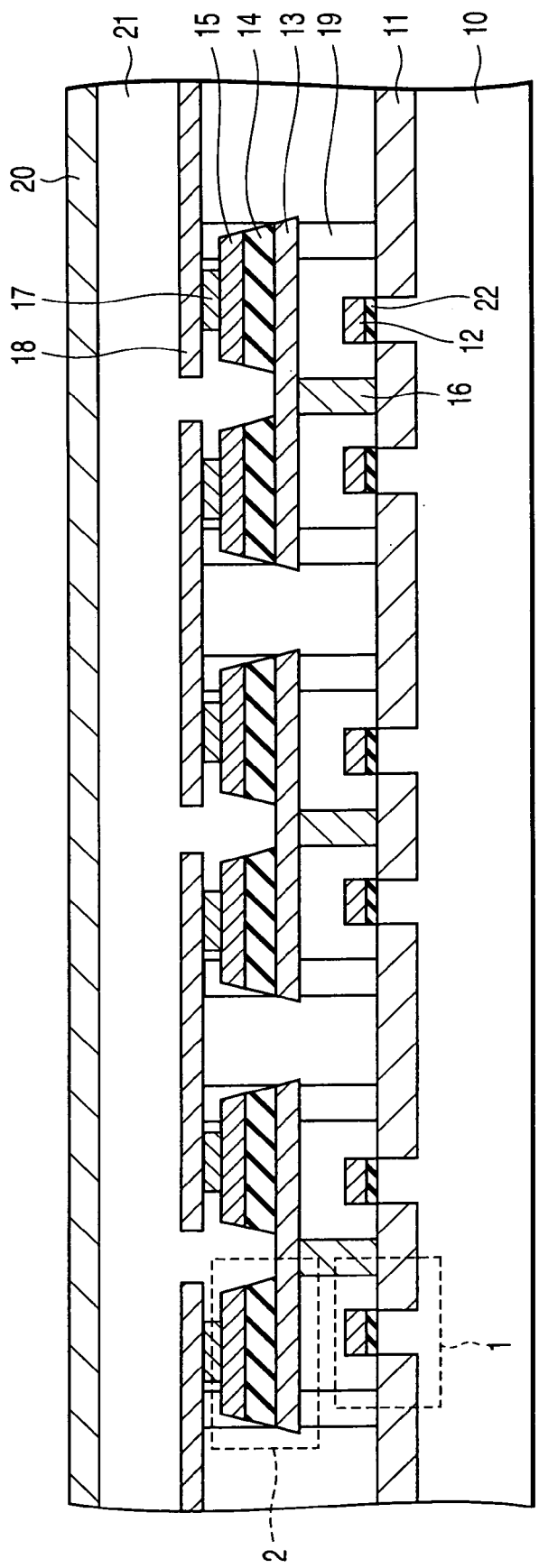
FIG. 3 is a diagram showing a cross section taken along the line III—III indicated in FIG. 2.

FIG. 2 is a layout diagram illustrating the structure of the FeRAM shown in FIG. 1. FIG. 3 is a diagram showing a cross section taken along the line III—III indicated in FIG. 2.

A gate electrode 12 is formed via a gate oxide 22 on a semiconductor substrate 10. The gate electrode 12 serves as a word line WL. A diffusion layer (AA: Active Area) 11 is provided on both sides of the gate electrode 12 in the semiconductor substrate 10, and the diffusion layer 11 serves as source and drain electrodes of the cell transistor 1 on both sides, respectively. As described above, a plurality of the above-explained cell transistors 1 are connected in series within the same memory cell block. More specification, the source or drain electrode of one cell transistor 1 is connected to the source or drain electrode of another cell transistor provided adjacent to the above cell transistor 1, respectively. In this embodiment, the source or drain electrodes of two cell transistors adjacent to each other are formed in the common diffusion layer 11.

It should be noted here that in the case where the source or drain electrodes of two cell transistors 1 adjacent to each other are formed in separate diffusion layers 11, the contact between the cell transistor 1 and the ferroelectric capacitor 2 is required for each of the diffusion layers 11, although the present invention is not limited to such a structure.

A ferroelectric capacitor 2 is provided above the cell transistor 1, and the ferroelectric capacitor 2 includes a lower electrode (LE) 13, a ferroelectric film 14 and an upper electrode (UE) 15. The lower electrode 13, ferroelectric film 14 and upper electrode 15 are laminated one on another in this order to form the ferroelectric capacitor 2. Lower electrodes 13 of two ferroelectric capacitor 2 formed adjacent to each other on one side are shared. The lower electrodes 13 and the diffusion layer 11 are connected to each other via an AA-LE contact 16. The AA-LE contact 16 is provided for each of the lower electrodes 13 in number.

The upper electrodes 15 of two ferromagnetic capacitors formed adjacent to each other in the other direction are connected together by a metal 18. That is, the lower electrode of one ferroelectric capacitor 2 and the lower electrode 13 of another ferroelectric capacitor 2 adjacent to the mentioned capacitor 2 on one side are commonly used, and the upper electrode 15 of that one ferroelectric capacitor 2 is connected to the upper electrode 15 of still another adjacent ferroelectric capacitor 2 adjacent on the other side. The upper electrode 15 and the metal 18 are connected to each other via an UE-M contact 17. The metal 18 and the diffusion layer 11 are connected to each other via an AA-M contact 19. The AA-M contact 19 is provided for each of the metals 18 in number.

A bit line 20 is provided above the memory cell MC. The memory cell block 5 is connected to the bit line via the block section transistor 3. The bit line BL20 and the bit line /BL20 are provided to be adjacent and in substantially parallel to each other. An insulating oxide layer 21 is formed on the semi-conductor substrate 10.

It should be noted that the AA-M contact 19 is not provided between the upper electrodes within the same memory cell block. More specifically, the AA-M contact 19 connected to one memory cell block 5 on the bit line BL side and the AA-M contact 19 connected to another memory cell block 5 on the bit line /BL side are provided between the upper electrodes 15 of these memory cell blocks 5.

Further, the AA-M contact 19 connected to one memory cell block 5 on the bit line BL side and the AA-M contact 19 connected to another memory cell block 5 on the bit line /BL side are arranged at positions complimentary to each other so that they do not overlap in a vertical direction to the extending direction of the bit line BL. The AA-M contact 19 is provided between a midpoint between the two upper electrodes 15 connected to the AA-M contact 19 and a midpoint between the two upper electrodes that share the lower electrode 13.

Each of the metals 18 has such a shape that connects two upper electrodes 15 and one AA-M contact 19 to each other. More specifically, the metal 18 on the bit line BL side has an overhang projecting to the bit line /BL side. The AA-M contact 19 is connected to the overhang of the metal 18. The diffusion layer 11 connected to the AA-M contact 19 has substantially the same shape as that of the metal wiring layer 18.

Figure 4:
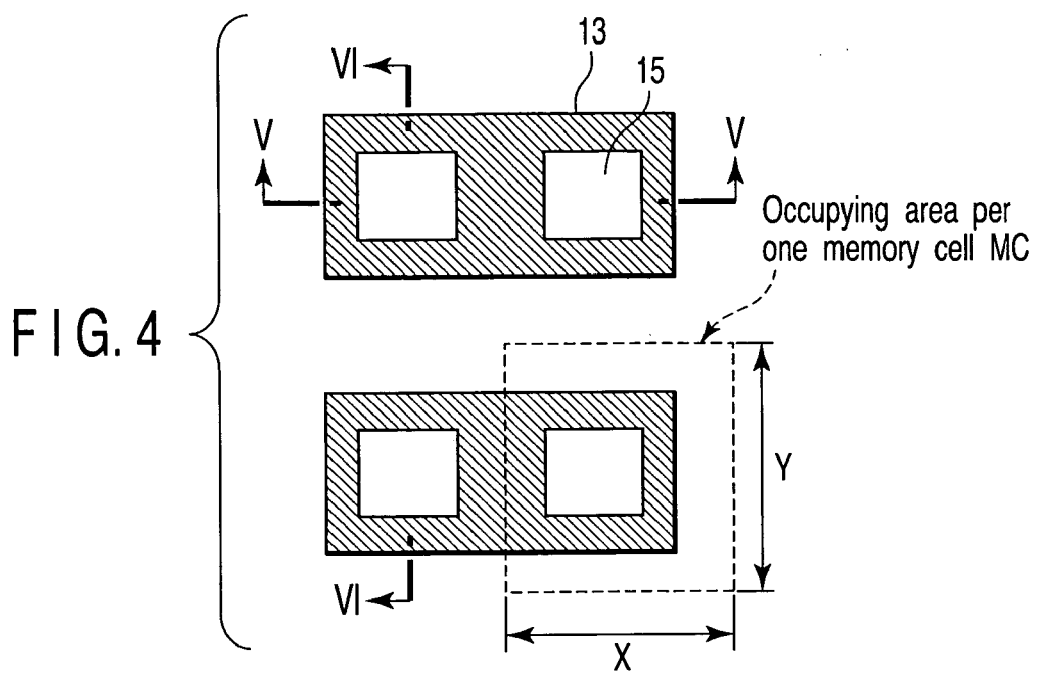
FIG. 4 is a diagram briefly illustrating the layout of two ferroelectric capacitors 2 on the bit line BL side and two ferroelectric capacitors 2 on the bit line /BL side.
Figure 5:
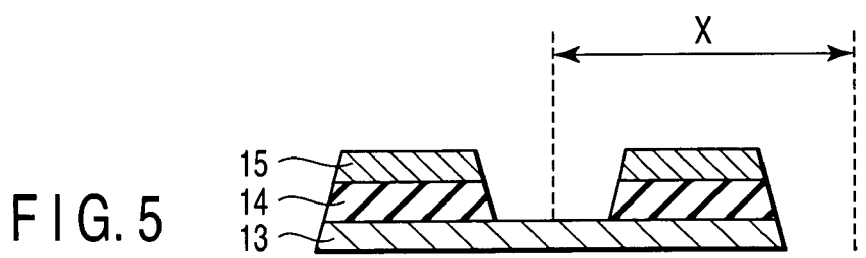
FIG. 5 is a diagram showing a cross section taken along the line V—V indicated in FIG. 4.
Figure 6:
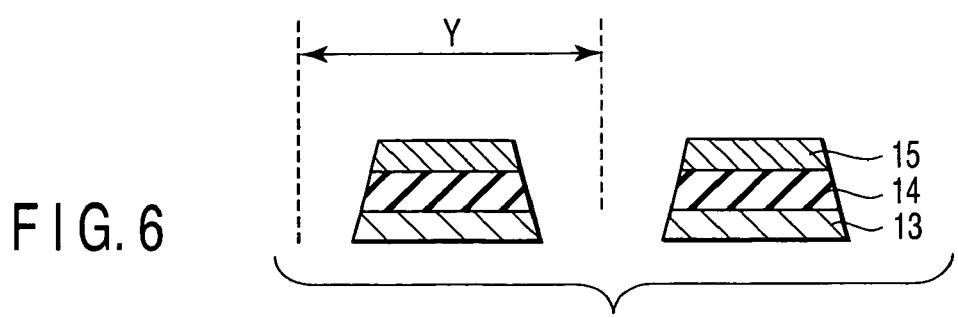
FIG. 6 is a diagram showing a cross section taken along the line VI—VI indicated in FIG. 4.
Figure 7:
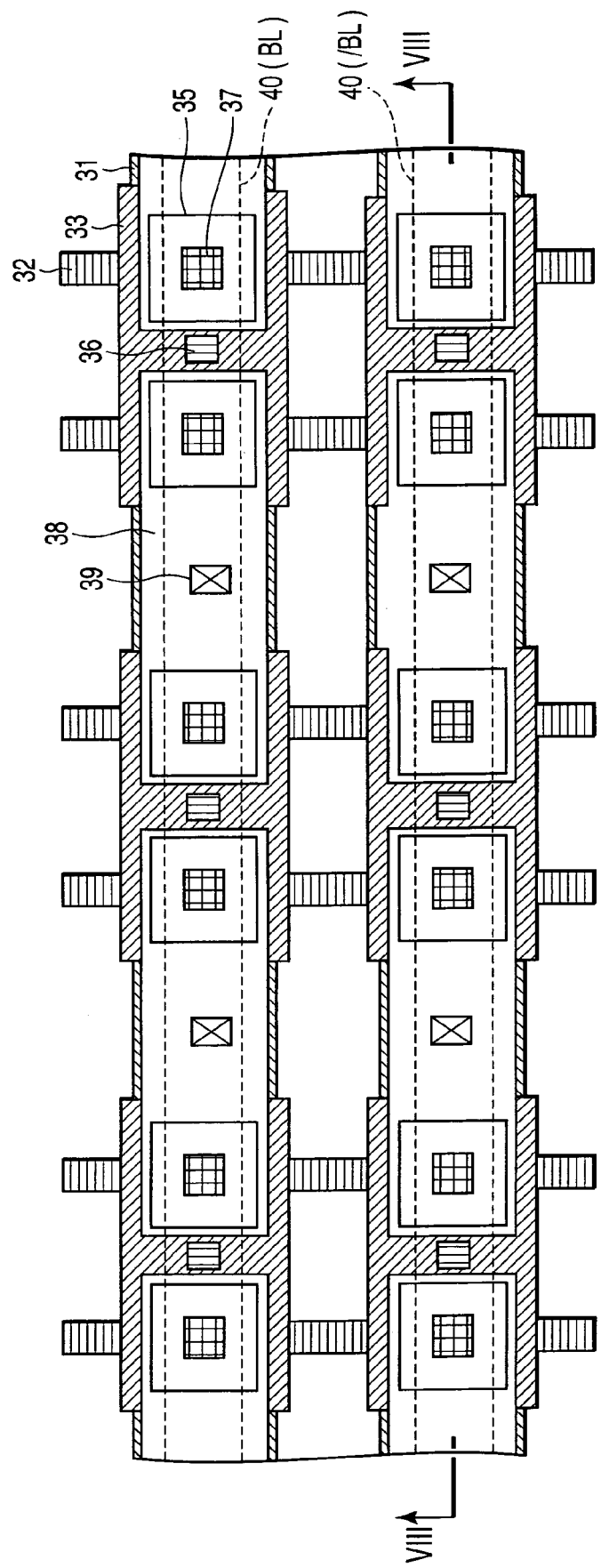
FIG. 7 is a diagram showing a layout of an example of the series connected TC unit type ferroelectric RAM.
Figure 8:
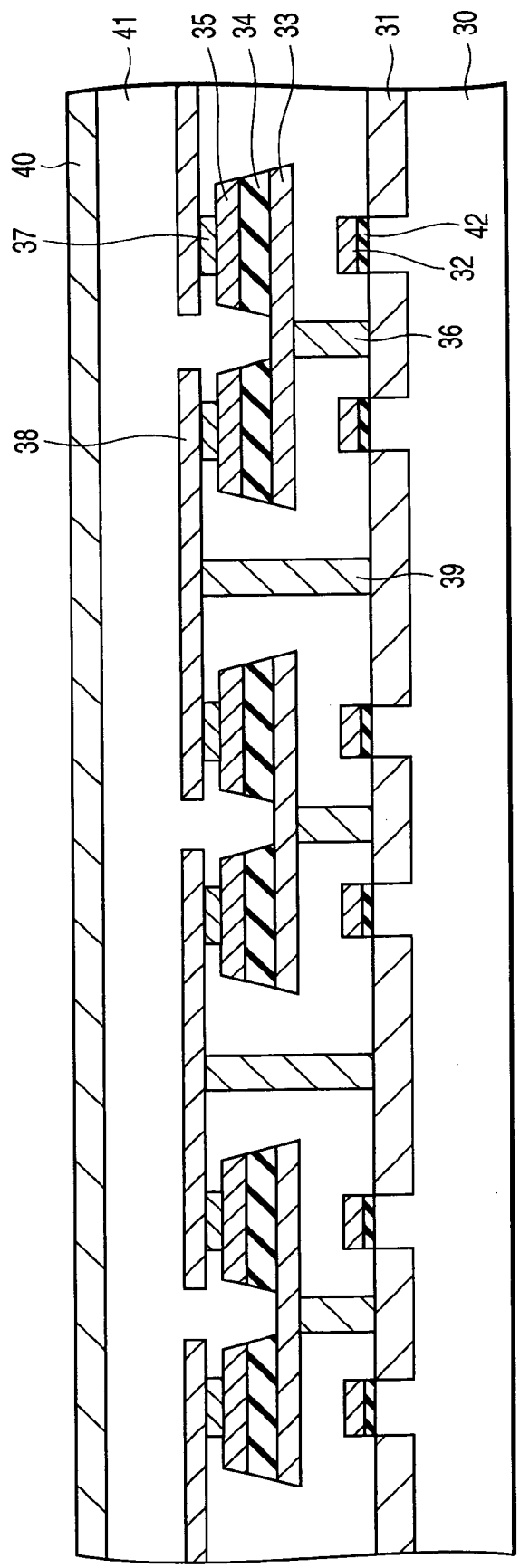
FIG. 8 is a diagram showing a cross section taken along the line VIII—VIII indicated in FIG. 7.

Next, the reason why the FeRAM that has the structure described in this embodiment can reduce the area will now be described. FIG. 4 is a diagram briefly illustrating the layout of two ferroelectric capacitors 2 on the bit line BL side, that share a lower electrode and two ferroelectric capacitors 2 on the bit line /BL side, that are located adjacent to the above two ferroelectric capacitors 2, respectively. FIG. 5 is a diagram showing a cross section taken along the line V—V indicated in FIG. 4, and FIG. 6 is a diagram showing a cross section taken along the line VI—VI indicated in FIG. 4.

In FIG. 4, the region indicated by dashed lines expresses an occupying area per one memory cell MC. The symbol "X" indicates a lateral length of the occupying area (in the extending direction of the bit line), whereas "Y" indicates a vertical length of the occupying area. The ferroelectric capacitor 2 has a tapered shape as shown in FIGS. 5 and 6 for the convenience of the FE RAM manufacturing process, and therefore the relationship (1) is established.

$$X < Y \quad (1)$$

The occupying area Ac per one memory cell MC in the case where the AA-M contact 19 is provided between the upper electrodes within the same memory cell block can be expressed by the following equation:

$$Ac = Y(X+cd) \quad (2)$$

where "cd" is the length that increases as an AA-M contact 19 is added.

As compared to the above, the occupying area Ac of the embodiment of the present invention can be expressed by the following equation:

$$Ap = X(Y + cd) \quad (3)$$

Therefore, from the relationship (1), the following relationship can be established:

$$Ap < Ac$$

As can be understood from this relationship, the embodiment of the present invention can reduce the occupying area as compared to the case where the AA-M contact 19 is provided between the upper electrodes within the same memory cell block.

As described above in detail, according to the embodiment of the present invention, the AA-M contact 19 that connects the upper electrode 15 of the ferro-electric capacitor 2 and the diffusion layer 11 of the cell transistor 1 is placed between two memory cell blocks 5 adjacent to each other. Further, the upper electrode 15 of one ferroelectric capacitor 2 is connected by means of the metal 18 to the upper electrode 15 of another ferroelectric capacitor 2 provided on one side adjacent to the above capacitor 2. Further, the lower electrode 13 of that one ferro-electric capacitor 2 and the lower electrode 13 of still another ferroelectric capacitor 2 provided on the other side adjacent to the capacitor 2 are shared. Further, each of the ferroelectric capacitor 2 is formed to have such a tapered shape that reduces its width towards the upper electrode 15.

With the above-summarized structure of this embodiment, the occupying area per one memory cell MC can be decreased, and therefore the circuit area of the FeRAM can be reduced.

Further, there is not AA-M contact 19 provided between the upper electrodes within the same memory cell block, the length of the bit line (in its extending direction) can be shortened. With this structure, the parasitic capacitance of the bit line can be reduced, and therefore the read signal amount of the bit line can be increase as a result.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a first bit line extending in a first direction;
a second bit line extending in the first direction and provided separate from the first bit line;
a first memory cell block including a first terminal connected to the first bit line by a first block select transistor, a second terminal, and a plurality of first memory cells connected in series between the first and second terminals in the first direction, each first memory cell including a first capacitor and a first cell transistor, which are connected in parallel, the first capacitor including a first lower electrode and a first upper electrode;
a second memory cell block including a third terminal connected to the second bit line by a second block select transistor, a fourth terminal, and a plurality of second memory cells connected in series between the third and fourth terminals in the first direction, each second memory cell including a second capacitor and a second cell transistor, which are connected in parallel, the second capacitor including a second lower electrode and a second upper electrode and provided adjacent to the first capacitor in a second direction perpendicular to the first direction;
a plurality of first wiring portions provided for first pairs of adjacent first capacitors, respectively, each first wiring portion electrically connecting, to each other, two first upper electrodes of the adjacent first capacitors;
a plurality of second wiring portions provided for second pairs of adjacent second capacitors, respectively, each second wiring portion electrically connecting, to each other, two second upper electrodes of the adjacent second capacitors, the second pairs being provided adjacent to the first pairs in the second direction, respectively;
a plurality of first contacts electrically connected to the first wiring portions and provided between the first capacitor and the second capacitor, each first contact being located on one side with respect to a line formed by connecting a first midpoint and a second midpoint, the first midpoint existing between the two first upper electrodes, and the second midpoint existing between the two second upper electrodes; and
a plurality of second contacts electrically connected to the second wiring portions and provided between the first capacitor and the second capacitor, each second contact being located opposite a respective first contact on the other side with respect to the line.

2. The semiconductor memory device according to claim 1, wherein the first and second contacts are located in a rectangle constituted by the two first upper electrodes and the two second upper electrodes.

3. The semiconductor memory device according to claim 1, wherein the first cell transistor includes a gate electrode, a source electrode and a drain electrode, the drain or source electrode of the first cell transistor being electrically connected to the first contact, and the second cell transistor includes a gate electrode, a source electrode and a drain electrode, the drain or source electrode of the second cell transistor being electrically connected to the second contact.

4. The semiconductor memory device according to claim 1, wherein the first capacitor includes a ferroelectric film provided between the first lower electrode and the first upper electrode, and the second capacitor includes a ferroelectric film provided between the second lower electrode and the second upper electrode.

5. The semiconductor memory device according to claim 1, wherein the first wiring portion has a first overhang connected to the first contact, and the second wiring portion has a second overhang connected to the second contact.

6. The semiconductor memory device according to claim 5, wherein the first overhang protrudes toward the second memory cell block in the second direction, and the second overhang protrudes toward the first memory cell block in the second direction.

7. The semiconductor memory device according to claim 5, wherein the first and second overhangs are rectangles in their plane.

8. The semiconductor memory device according to claim 1, wherein the first and second upper electrodes are rectangles in their plane.

9. The semiconductor memory device according to claim 1, wherein the first contacts are located in an area other than an area opposite to the second memory cell block with respect to the first memory cell block, and the second contacts are located in an area other than an area opposite to the first memory cell block with respect to the second memory cell block.

10. The semiconductor memory device according to claim 1, wherein the first contacts are located outside an area between the first capacitors of the first memory cells, and the second contacts are located outside an area between the second capacitors, but outside the area between the second capacitors.

11. The semiconductor memory device according to claim 1, wherein the first and second contacts are rectangles in their plane.

12. The semiconductor memory device according to claim 11, wherein the first and second contacts have no sides inclined at a 45-degree angle in their plane with respect to the first direction.

13. The semiconductor memory device according to claim 3, further comprising third pairs of adjacent first capacitors and fourth pairs of adjacent second capacitors, wherein
each third pair shares a first lower electrode, one first capacitor of the third pair is used in common with one first capacitor of the first pair,
each fourth pair shares a second lower electrode, and one second capacitor of the fourth pair is used in common with one second capacitor of the second pair.

14. The semiconductor memory device according to claim 13, wherein the first and second lower electrodes are rectangles in their plane.

15. The semiconductor memory device according to claim 6, wherein the first overhang is arranged not to overlap the second overhang in the second direction.

16. The semiconductor memory device according to claim 1, further comprising a third contact which electrically connects the first upper electrode and a corresponding one of the first wiring portions, and a fourth contact which electrically connects the second upper electrode and a corresponding one of the second wiring portions.

17. The semiconductor memory device according to claim 3, further comprising a fifth contact which electrically connects the first lower electrode and the source or drain electrode of the first cell transistor, and a sixth contact which electrically connects the second lower electrode and the source or drain electrode of the second cell transistor.

18. The semiconductor memory device according to claim 1, wherein the first and second upper electrodes have areas smaller than the first and second lower electrodes, respectively.

19. The semiconductor memory device according to claim 3, wherein the source and drain electrodes are formed in diffusion layers, and two adjacent cell transistors share a corresponding one of the diffusion layers in the first direction.

* * * * *